US012763448B2

(12) United States Patent
Singh et al.

(10) Patent No.: US 12,763,448 B2
(45) Date of Patent: Oct. 13, 2026

(54) MULTI-RESONATOR RANDOM ACCESS QUANTUM MEMORY WITH INTEGRATED MAGNET-LESS CIRCULATOR

(71) Applicant: Dell Products L.P., Round Rock, TX (US)

(72) Inventors: Tejinder Singh, Manotick (CA); Navjot Kaur Khaira, Manotick (CA)

(73) Assignee: Dell Products L.P., Round Rock, TX (US)

( * ) Notice: Subject to any disclaimer, the term of this patent is extended or adjusted under 35 U.S.C. 154(b) by 40 days.

(21) Appl. No.: 18/967,616

(22) Filed: Dec. 3, 2024

(65) Prior Publication Data

US 2026/0171644 A1 Jun. 18, 2026

(51) Int. Cl.
*H01P 1/38* (2006.01)
*H03H 9/72* (2006.01)

(52) U.S. Cl.
CPC ............... *H01P 1/38* (2013.01); *H03H 9/725* (2013.01)

(58) Field of Classification Search
CPC .................................. H01P 1/38; H03H 9/725
See application file for complete search history.

(56) References Cited

U.S. PATENT DOCUMENTS 9,405,136 B2 8/2016 Alu et al.
11,677,129 B2 6/2023 Stace et al.
12,451,575 B2 10/2025 Khaira et al.
2017/0091648 A1 3/2017 Abdo
2018/0040935 A1* 2/2018 Sliwa ...................... H03F 3/605
2019/0372192 A1 12/2019 Mueller
2023/0155593 A1* 5/2023 Abdo ........................ H01P 1/38 326/3

(Continued)

FOREIGN PATENT DOCUMENTS

WO 2021/140995 A1 7/2021

OTHER PUBLICATIONS

R. Fleury et al., "Sound isolation and giant linear nonreciprocity in a compact acoustic circulator," Science, vol. 343, No. 6170, pp. 516-519, 2014.

(Continued)

*Primary Examiner* — Xiaochun L Chen
(74) *Attorney, Agent, or Firm* — Amin, Turocy & Watson, LLP

(57) ABSTRACT

The technology described herein is directed towards a multi-bit random-access quantum memory (RAQM) system based on reconfigurable tunable resonators. The RAQM system includes an array of (e.g., four) tunable high-Q resonators which, when one is tuned to the same frequency as a common (shared) broadband tunable low quality resonator, strongly interact to write a qubit to the high-Q resonators, and similarly readout a previously stored qubit. The shared low-Q and multiple high-Q resonators can be fabricated in a monolithically-integrated stack, without consuming a large circuit footprint or chip area. The low-Q resonator can be coupled to an external feed-line to obtain the qubits through a circulator, facilitating efficient read/write operations from and to the quantum memory storage portion of the RAQM system. In one implementation, the circulator is a magnet-less circulator, facilitating deployment of the RAQM system at cryogenic temperatures.

20 Claims, 11 Drawing Sheets

(56) References Cited

U.S. PATENT DOCUMENTS

2024/0372627 A1 11/2024 Abdo

OTHER PUBLICATIONS

J. C. Bardin et al. "Microwaves in Quantum Computing" in IEEE Journal of Microwaves, Jan. 2021.
S. Krinner et al. "Engineering cryogenic setups for 100-qubit scale superconducting circuit systems" in EPJ Quantum Technology, vol. 6, No. 1, 2019.
"High Power Circulator With 20 dB Isolation From 7 GHz to 12.4 GHZ, 50 Watts And SMA Female—Product ID: PE83CR1008" Pasternack. [https://www.pasternack.com/high-power-circulator-20db-isolation-12.4-ghz-50-watts-sma-female-pe83cr1008-p.aspx] retrieved Dec. 8, 2025, 4 pages.
"Multiresonator quantum memory-interface"—Scientific Figure on ResearchGate. Available from: [https://www.researchgate.net/figure/a-Simulation-of-the-microwave-field-in-the-QMI-system-using-the-CST-Studio-Suite-2015_fig3_319209666], retrieved Dec. 8, 2025, 13 pages.
Moiseev et al. "Broadband multiresonator quantum memory-interface" Scientific Reports, Mar. 2018, 9 pages.
Khaira et al. "Magnet-Less Circulator for Hybrid-Classical Qubit Read-Out Systems With Built-in Phase Modulation" U.S. Appl. No. 18/919,198, filed Oct. 17, 2024, 43 pages.
Singh et al. "Superconducting Magnet-Less Circulator for Monolithically Integrated Quantum Memory Devices" U.S. Appl. No. 18/967,611, filed Dec. 3, 2024, 43 pages.
Non-Final Office Action received for U.S. Appl. No. 18/919,198 dated May 18, 2026, 11 pages.
Notice of Allowance received for U.S. Appl. No. 18/919,198 dated Jul. 15, 2026, 10 pages.
Non-Final Office Action received for U.S. Appl. No. 18/967,611 dated Jul. 13, 2026, 29 pages.

* cited by examiner

MULTI-RESONATOR RANDOM ACCESS QUANTUM MEMORY WITH INTEGRATED MAGNET-LESS CIRCULATOR

RELATED APPLICATIONS

The subject patent application is related to U.S. patent application Ser. No. 18/919,198, filed Oct. 17, 2024, and entitled "MAGNET-LESS CIRCULATOR FOR HYBRID-CLASSICAL QUBIT READ-OUT SYSTEMS WITH BUILT-IN PHASE MODULATION", and U.S. patent application Ser. No. 18/967,611, filed Dec. 3, 2024, and entitled "SUPERCONDUCTING MAGNET-LESS CIRCULATOR FOR MONOLITHICALLY INTEGRATED QUANTUM MEMORY DEVICES", the respective entireties of which patent applications are hereby incorporated by reference herein.

BACKGROUND

When scaling such quantum memory devices to store multiple quantum bits (qubits), careful frequency allocation is needed so that that the stored qubits do not interact with one another. However, due to environmental factors or fabrication imperfections, quantum storage resonators, like other quantum components, can experience frequency drifts relative to their designed, allocated frequencies, which can cause problems.

BRIEF DESCRIPTION OF THE DRAWINGS

The technology described herein is illustrated by way of example and not limited to the accompanying figures in which like reference numerals indicate similar elements and in which.

DETAILED DESCRIPTION

Figure 1:
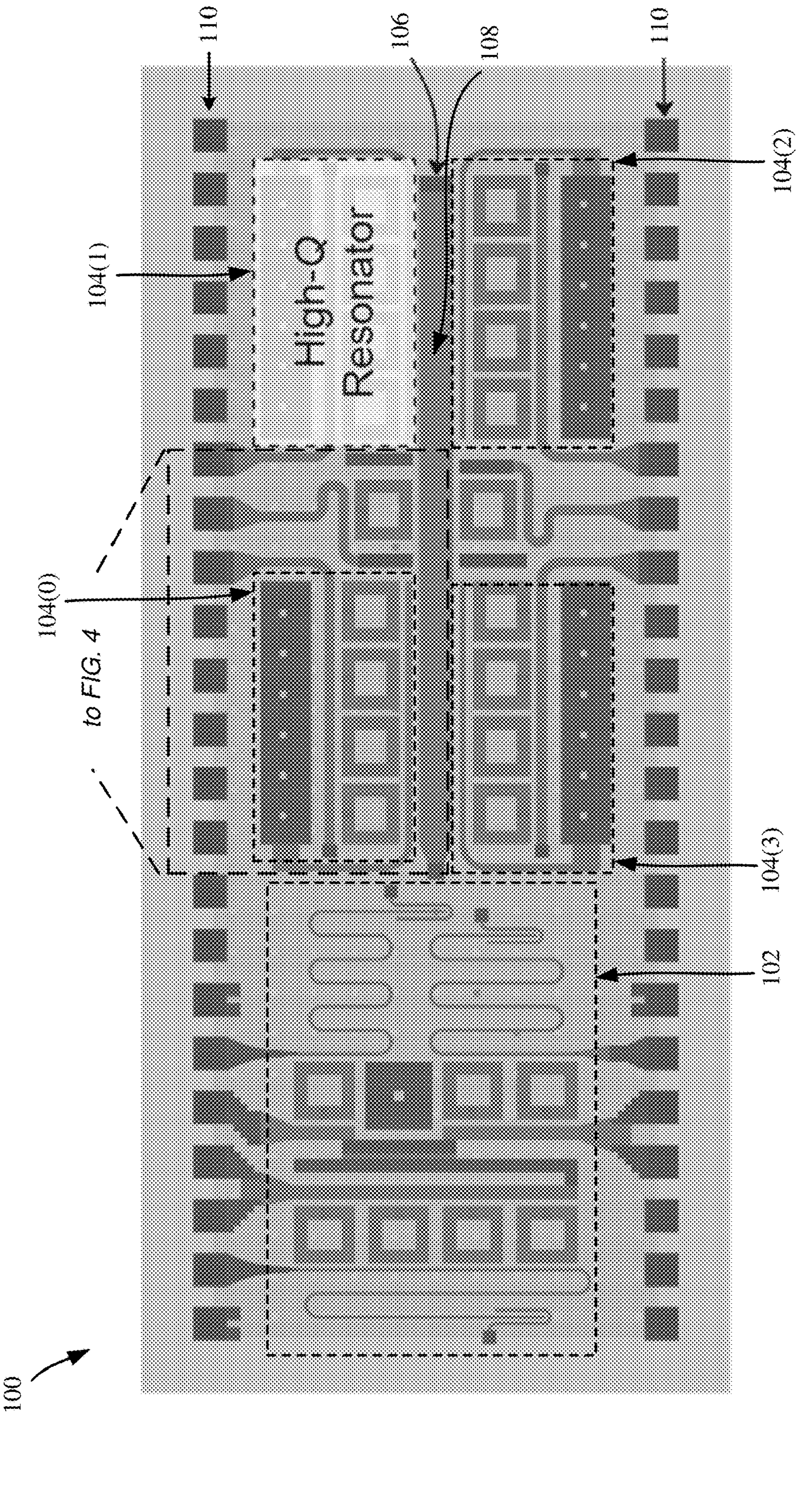
FIG. 1 is a top-view representation of an example four-bit quantum storage device with an integrated magnet-less circulator, in accordance with various example embodiments and implementations of the subject disclosure.

The technology described herein is generally directed towards a reconfigurable, monolithically-integrated multi-bit random-access quantum memory (RAQM) system based on tunable resonators. The RAQM system includes an array of (e.g., four) tunable high quality (high-Q) resonators, capitalizing on their ability to offer precise control and adaptability. When one selected high-Q resonator is tuned to a frequency that matches that of a tunable low quality (low-Q) common (shared) broadband resonator, the tunable shared resonator and the selected high-Q resonator strongly interact, facilitating a quantum bit (qubit) write operation to the selected tunable high-Q resonator, and similarly a read operation. The tunable nature of the high-Q resonators allows for dynamic frequency adjustment, enhancing the system's flexibility and the stability of stored quantum states. Moreover, the shared low-Q and multiple high-Q resonators can be fabricated in a stack, without consuming a large circuit footprint or chip area. The array of (e.g., four) memory cells can be a subarray of a larger quantum memory system of multiple such subarrays.

In general, the quantum storage cells described herein are based on matching the resonance frequency of the shared, tunable low-Q resonator to that of one selected high-Q quantum storage cavity resonator of the array, which transfers the energy of a qubit to the selected quantum storage cavity, facilitating a write operation. The resonance frequencies are detuned, thereby storing the quantum bit in the quantum storage cavity, until later retuned to transfer the quantum bit back, facilitating a read operation. In one implementation, so that each quantum memory cell is independently written to/read from without interference from other cells, each of the high-Q quantum memory cells selected for a read or write operation are tuned to a sufficiently different resonance frequency, (matched by the shared tunable resonator) relative to the other, non-selected high-Q quantum memory cells.

In one implementation, the low-Q resonator is coupled to an external feed-line to obtain the quantum bits (qubits) through a circulator, facilitating efficient read/write operations from and to the quantum memory storage portion of the RAQM system. The circulator can be a magnet-less circulator, facilitating deployment of the RAQM system at cryogenic temperatures, and also providing other benefits, such as not needing bulky magnets for the circulator. The magnet-less circulator also allows bypass of the RAQM (e.g., for direct readout of the qubit) without needing a switch.

Reference throughout this specification to "one embodiment," "an embodiment," "one implementation," "an implementation," etc. means that a particular feature, structure, characteristic and/or attribute described in connection with the embodiment/implementation can be included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, characteristics and/or attributes may be combined in any suitable manner in one or more embodiments/implementations. Repetitive description of like elements employed in respective embodiments may be omitted for sake of brevity.

The detailed description is merely illustrative and is not intended to limit embodiments and/or application or uses of embodiments. Furthermore, there is no intention to be bound by any expressed or implied information presented in the preceding sections, or in the Detailed Description section. Further, it is to be understood that the present disclosure will be described in terms of a given illustrative architecture; however, other architectures, structures, materials and process features, and steps can be varied within the scope of the present disclosure.

It also should be noted that terms used herein, such as "optimize," "optimization," "optimal," "optimally" and the like only represent objectives to move towards a more optimal state, rather than necessarily obtaining ideal results. Similarly, "maximize" means moving towards a maximal state (e.g., up to some processing capacity limit), not necessarily achieving such a state, and so on.

It will also be understood that when an element such as a layer, region or substrate is referred to as being "on" or "over" "atop" "above" "beneath" "below" and so forth with respect to another element, it can be directly on the other element or intervening elements can also be present. In contrast, only if and when an element is referred to as being "directly on" or "directly over" another element, are there no intervening element(s) present. Note that orientation is generally relative; e.g., "on" or "over" can be flipped, and if so, can be considered unchanged, even if technically appearing to be under or below/beneath when represented in a flipped orientation. It will also be understood that when an element is referred to as being "connected" or "coupled" to another element, it can be directly connected or coupled to the other element or intervening elements can be present. In contrast, only if and when an element is referred to as being "directly connected" or "directly coupled" to another element, are there no intervening element(s) present.

The following detailed description is merely illustrative and is not intended to limit embodiments and/or application or uses of embodiments. Furthermore, there is no intention to be bound by any expressed or implied information presented in the preceding sections, or in the Detailed Description section.

One or more example embodiments are now described with reference to the drawings, in which example components, graphs and/or operations are shown, and in which like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details, and that the subject disclosure may be embodied in many different forms and should not be construed as limited to the examples set forth herein.

FIG. 1 shows a top view of an example quantum storage device 100, which, as described herein in one implementation, includes a circulator 102, and an array of four tunable high-Q resonators 104(0)-104(3) corresponding to the storage portions (e.g., quantum storage cavities) of the memory cells. A shared, tunable low-Q resonator 106 obtains qubits from the circulator 102; (in FIG. 1, the inductor portion 108 of the tunable low-Q resonator 106 is shown, with the capacitor portion shown in the bottom view of FIG. 2). Connection pads (shaded squares collectively labeled 110) to the quantum storage device 100 are shown for coupling the device 100 to a computing device to control the resonators' frequencies, and for coupling to the device's circulator ports (one of which obtains the qubit input) as described herein.

Additional details of the tunable high-Q resonators 104(0)-104(3) are described with reference to FIG. 4. Additional details of the circulator 102 are described with reference to FIGS. 9 and 10.

Figure 2:
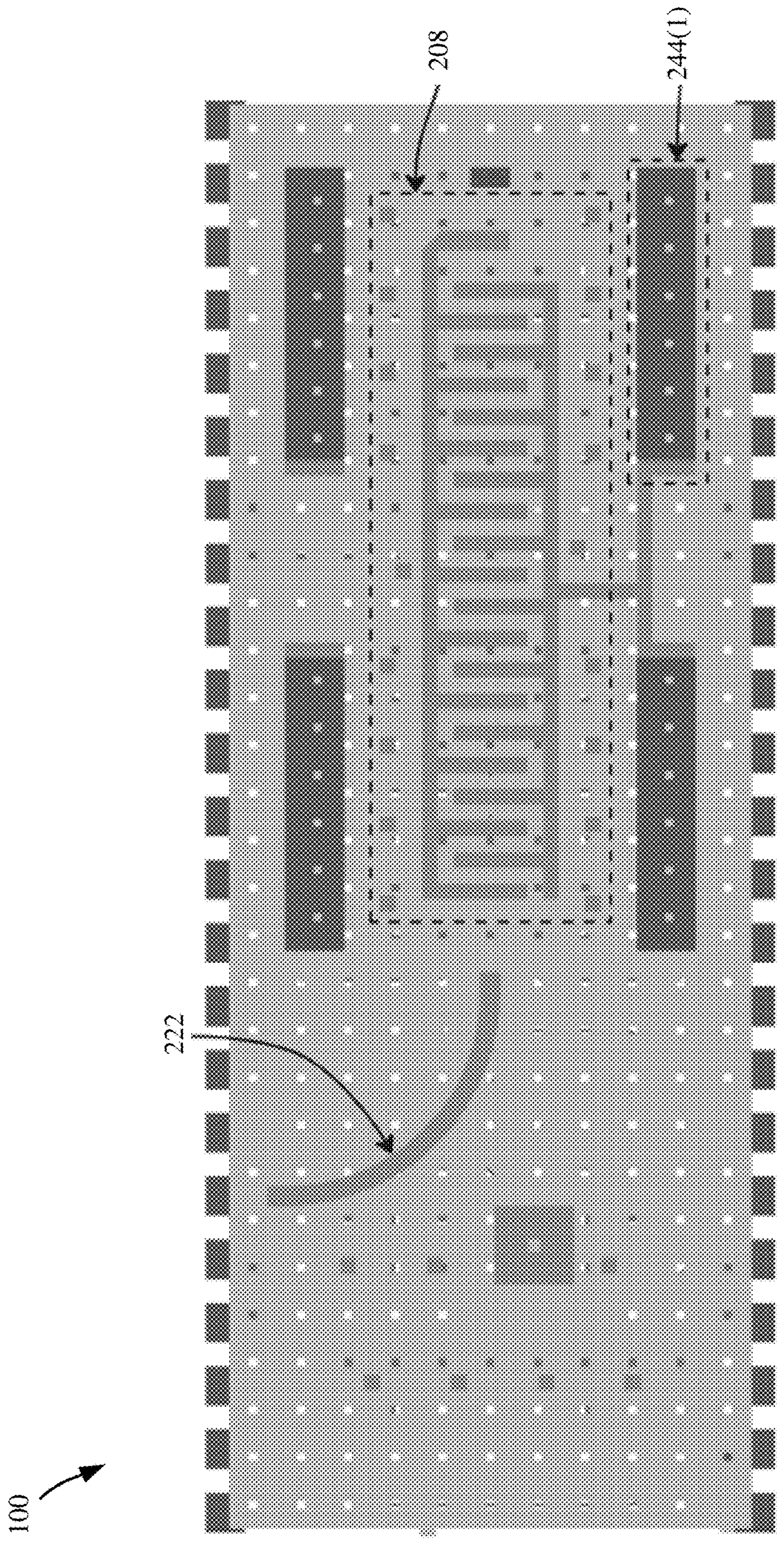
FIG. 2 is a bottom-view representation of the example four-bit quantum storage device with integrated magnet-less circulator, in accordance with various example embodiments and implementations of the subject disclosure.

FIG. 2 shows the bottom view of the example quantum storage device 100 of FIG. 1. The capacitor portion 208 of the tunable low-Q resonator 106 is visible in FIG. 2, which in this example is an interdigitated capacitor. FIG. 2 also shows a lowest layer of the multi-stacked capacitor 244(1) for the high-Q resonator 104(1). Also shown in FIG. 2 is a conductor 222 coupling circulator port2 to the low-Q resonator 108, from a near-upper superconducting thin film (STF) stack layer (STF6) to a lower stack layer STF0 and back to STF6.

Figure 3:
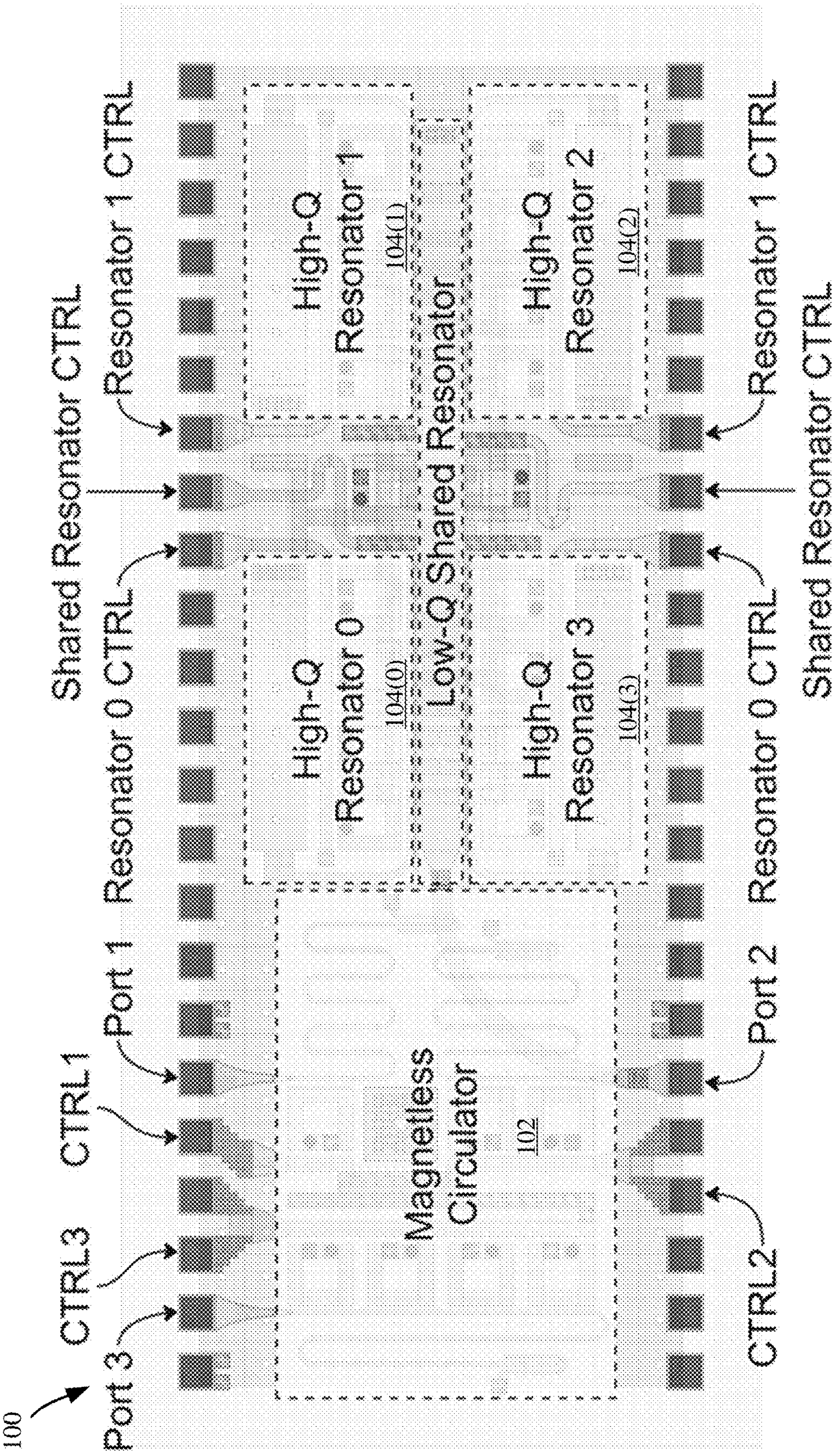
FIG. 3 is a conceptual block diagram showing an example four-bit quantum storage device with an integrated magnet-less circulator, in accordance with various example embodiments and implementations of the subject disclosure.

FIG. 3 shows the layout of the example implementation of the quantum storage device 100 of FIGS. 1 and 2. In FIG. 3, the resonator control (CTRL) contact pads to the inductive lines that tune the resonant frequencies of the high-Q resonators 104(0)-104(3) are labeled Resonator 0 CTRL-Resonator 3 CTRL, respectively. The shared resonator's control pads/lines are labeled as the shared Resonator CTRL. Also labeled in FIG. 2 are the contact pads for the lines for the circulator's ports Port1-Port 3, and the control lines that resonate the circulator's tank circuits at controlled frequencies, which are labeled CTRL1-CTRL3, respectively, as described with reference to FIGS. 9 and 10.

Figure 4:
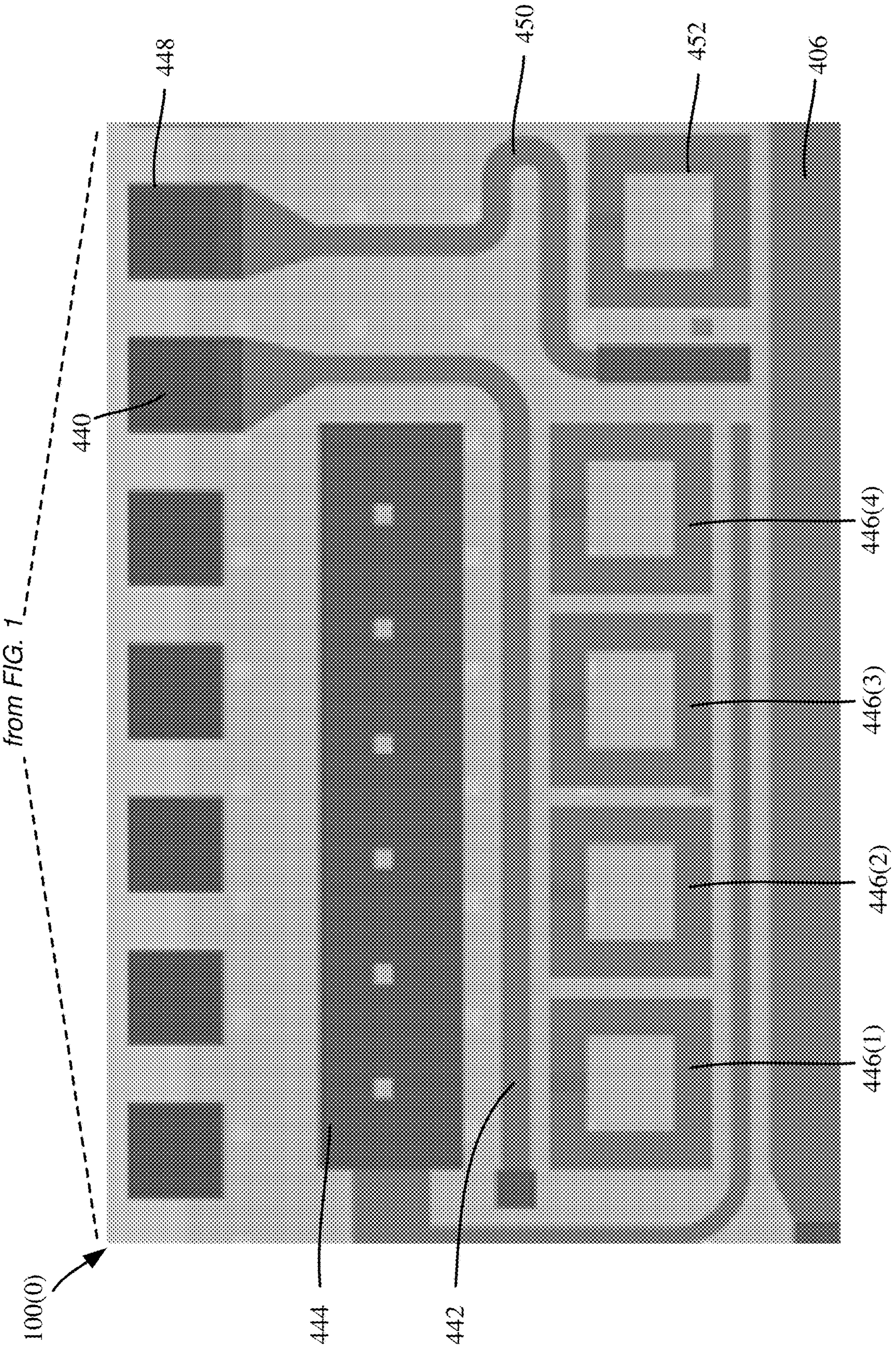
FIG. 4 is an enlarged (relative to FIG. 2) top-view representation of one portion of the example four-bit quantum storage device with integrated magnet-less circulator, in accordance with various example embodiments and implementations of the subject disclosure.

FIG. 4 shows an enlarged view of the high-Q resonator 104(0) corresponding to one quantum memory cell of the array. In the example of FIG. 4, the tunable inductor 442 and the capacitor 444 of the tunable high-Q resonator 104(0) operate based on a control signal (a controlled amount of current) applied (e.g., via contract 440/Resonator 0 CTRL) that changes the magnetic flux of the radio frequency-superconducting interference devices (rf-SQUIDS) 446(1)-446(4), which are coupled to the tunable inductor 442, and thereby changes the inductance of the tunable inductor 442, and hence the resonant frequency of the high-Q resonator 104(0).

As is known, each of the rf-SQUIDS 446(1)-446(4) has one Josephson junction shunted by an inductive superconductive loop. A Josephson junction is a fundamental component in superconducting quantum circuits, made from two superconductors separated by a thin insulating barrier. When a current flows through the junction, the current can tunnel through the insulator without any voltage drop, a phenomenon known as the Josephson effect. A rf-SQUID combines the physical phenomenon of flux quantization and Josephson tunneling.

The quantum storage cavity also has a portion of the shared resonator labeled 406 (the coupling capacitor is not visible in this view), which in this implementation is inductively coupled to (at least one) rf-SQUID 452. A controlled resonator current applied at the contact 448 connected to a wire 450 inductively coupled to the rf-SQUID 452 similarly changes the magnetic flux of the rf-SQUID 452 and thereby tunes the inductance of the resonator 406 and corresponding resonance frequency of the shared resonator.

When the frequencies of the shared resonator and the tunable high-Q resonator 104(0) closely match, the resonators are strongly coupled, allowing a write operation (of a qubit at the circulator input) to the high-Q resonator 104(0). The resonators are detuned, whereby the qubit energy remains in the high-Q resonator 104(0) for a reasonable time, e.g., on the order of millisecond(s), long enough for a readout to occur. To read the qubit energy back, the low-Q and high-Q resonators are retuned, whereby the resonators strongly interact and the qubit state can be read via the contact 440.

Figure 5:
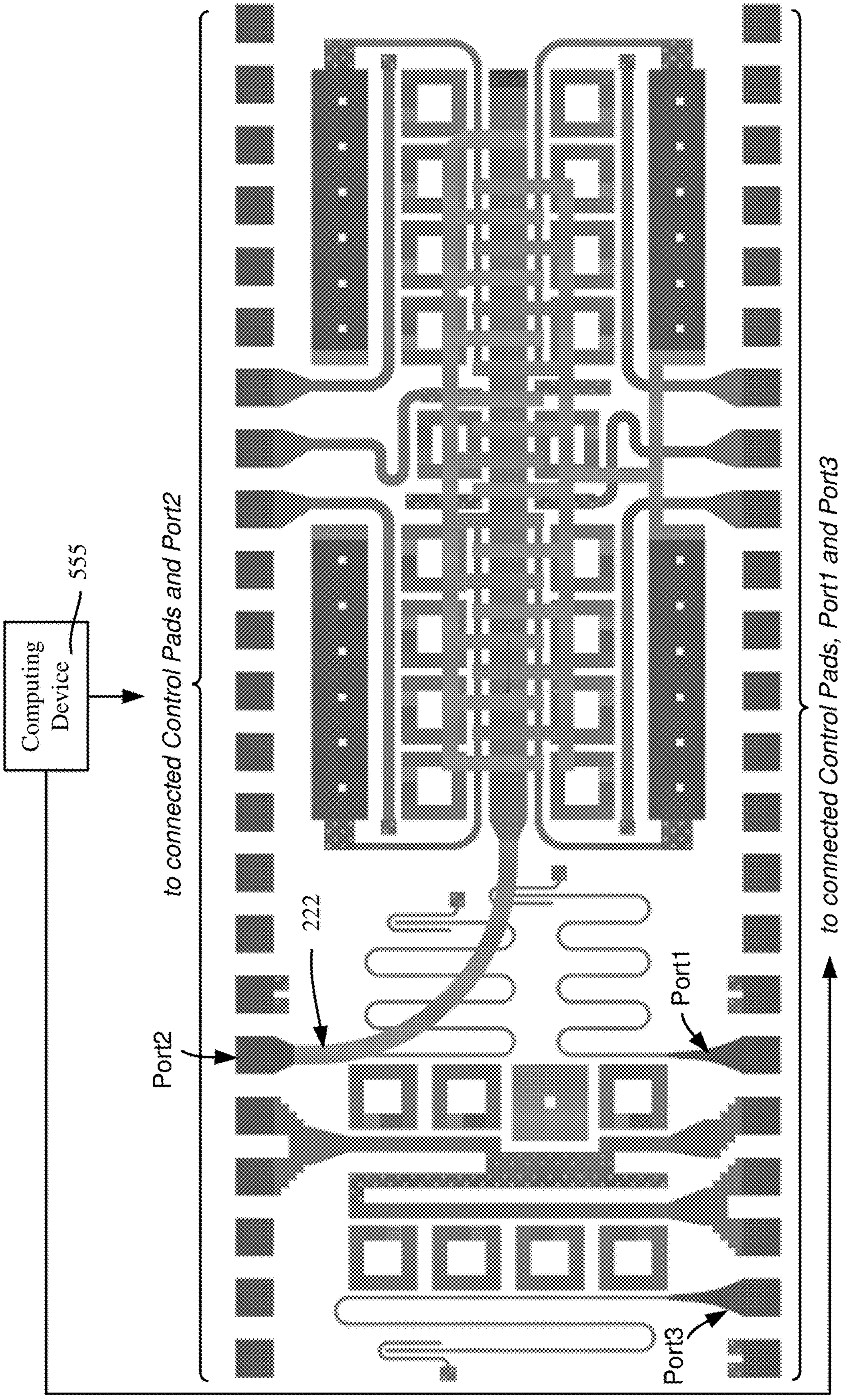
FIG. 5 is a layered-view representation of an example broadband multi-resonator quantum memory interface, (with certain layers omitted for better visualization) in accordance with various example embodiments and implementations of the subject disclosure.

Control of the write and read operations can be via a non-quantum (e.g., classical) computing device 555 in FIG. 5, which shows the components overlaid (with some layers omitted for visibility). Note that similar to FIG. 2, FIG. 5 is flipped relative to FIG. 1.

To summarize, for a qubit write to one quantum memory cell, or a read therefrom, the corresponding tunable high-Q resonator and the broadband tunable low-Q resonator are tuned by control signals (control currents) from the computing device 555 to closely-matched frequencies so that the resonators strongly interact, with the common broadband tunable low Q-resonator low Q resonator coupled to an external feed line 222 through the circulator Port2. It should be noted that the readout can be directly from Port2 (or Port3, further preventing interference) by coupling a measurement device thereto, and bypassing storage by not coupling Port2 to any high-Q resonator via detuned resonance frequencies.

In general, a circulator device (or simply "circulator") is a nonreciprocal three-port device that controls the direction of signal flow. Unlike reciprocal devices where signals can flow in both directions equally, a circulator allows signals to travel in only one predetermined direction among its three ports. Thus, when the qubit signal goes in Port1, that signal is routed to Port2, and the signal that is on Port2 is routed to Port3. Via Port2, the qubit signal is coupled to the low Q resonator via the line 222. Note that one reason a circulator is employed is for stability, in that the signal routed to Port2 is (for the most part) prevented from going back to Port1 and interfering with the qubit signal input. Similarly, for bypassing storage, the readout can be from Port3.

The classical computing device 555 is thus able to resonate a selected high-Q resonator with the shared resonator and thereby write (or read) the qubit to (or from) any one of the four memory cells depending on which is selected and resonated to closely match the shared resonator frequency. Note that writes and reads are not parallel, but only to a selected high-Q resonator, e.g., sequential access is one way to select the memory cells. In other words, the microwave photons available at the low-Q shared resonator can be chosen for storage in resonator 0 (104(0)), resonator 1 (104(1)), resonator 2 (104(2)) or resonator 3 (104(3)). Although only one high-Q resonator can be addressed at a time, the footprint is significantly smaller than quantum memory cells that can be addressed in parallel, and is thus more suitable for certain qubit storage scenarios.

Figure 6:
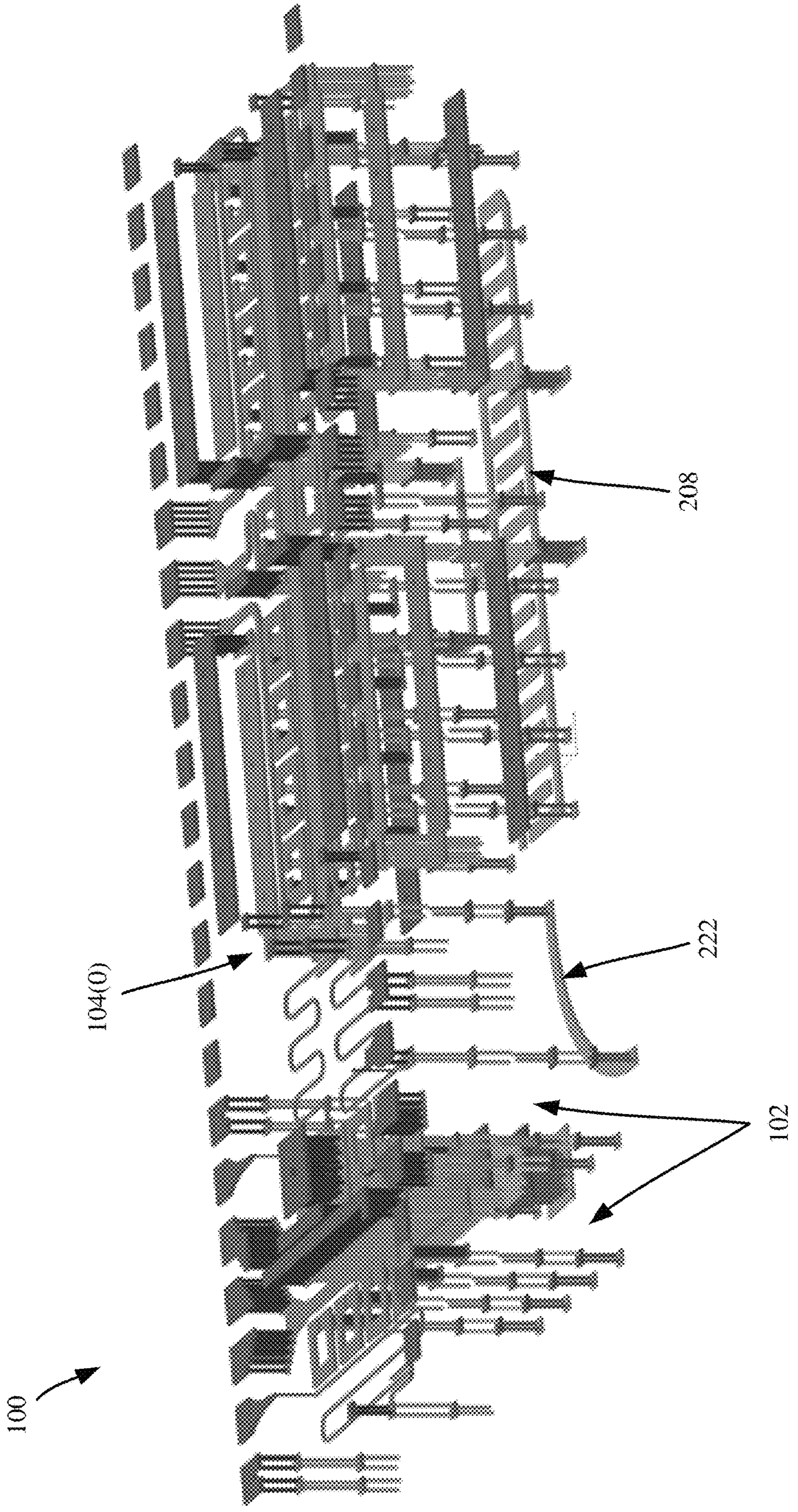
FIG. 6 is a three-dimensional (3D) view representation of an example broadband multi-resonator quantum memory interface stack, (with certain layers omitted for better visualization), in accordance with various example embodiments and implementations of the subject disclosure.
Figure 7:
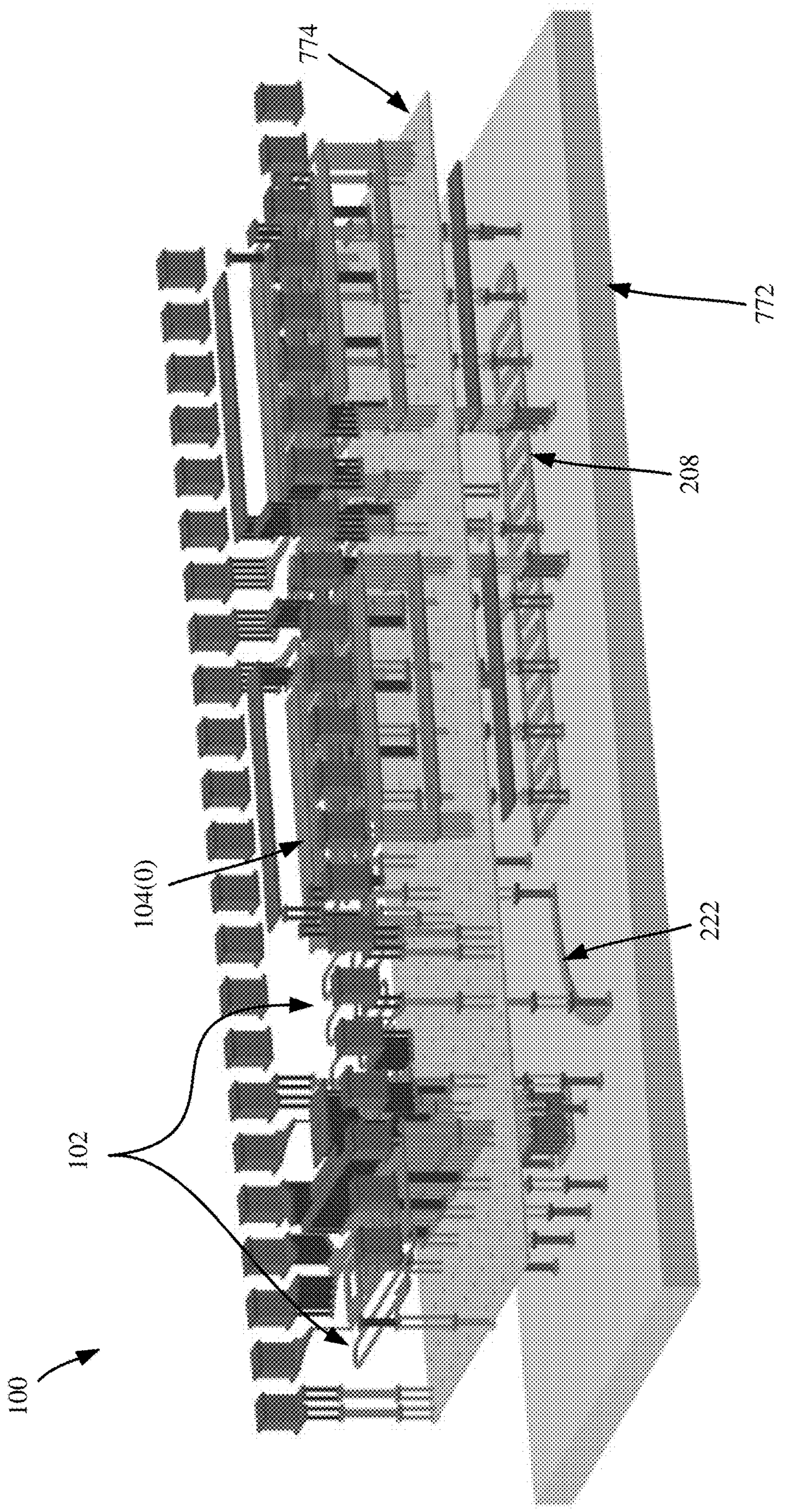
FIG. 7 is a 3D view representation of the example broadband multi-resonator quantum memory interface stack with layers included, in accordance with various example embodiments and implementations of the subject disclosure.

FIGS. 6 and 7 show three-dimensional (3D) view representations of a layout of the example broadband multi-resonator quantum memory interface stack. The Z-direction is scaled larger than the actual design to highlight all the layers in the stack. Some of the components in FIGS. 6 and 7 are labeled so as to relate the 3D views to the two-dimensional (2D) view of FIGS. 1 and 2. Note that in FIG. 6, relative to FIG. 7, the substrate 772 and STF3 shield plane layer 774 of FIG. 7 are omitted for better visualization.

Figure 8:
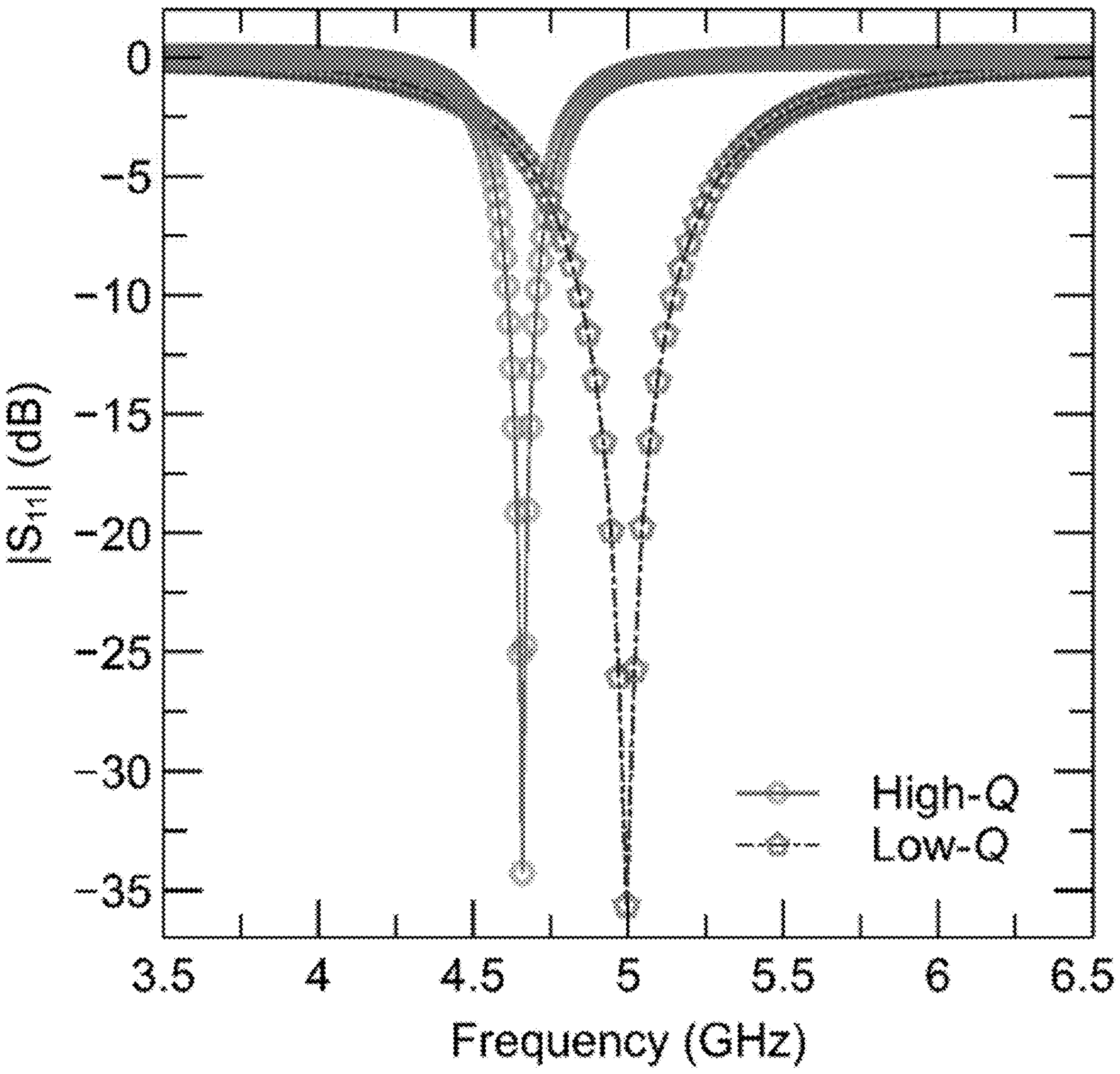
FIG. 8 is a graphical representation of resonance frequency results for one example simulation of low quality factor (low-Q) and high quality factor (high-Q) resonators designed for an example random access quantum memory, in accordance with various example embodiments and implementations of the subject disclosure.

FIG. 8 is a graphical representation of an example simulation of low-Q and high-Q resonators designed for the RAQM system 100. The high-Q and low-Q resonators were simulated in Ansys HFSS to show the simulated resonance frequency. Benefits of tunable high-Q and low-Q resonators include, but are not limited to, the tuning of both the storage and interface resonators that make it possible to dynamically match their frequencies during specific operations, such as state transfer or read/write processes. This capability can optimize the coupling strength and minimize errors during these operations. A tunable storage resonator can compensate for any drifts in operating frequency due to the fabrication tolerances or environmental factors, thus making the design more resilient. Tunable storage resonators allow for greater flexibility in adjusting qubit frequencies, thereby avoiding unwanted interactions and cross-talk between qubits, which is needed for maintaining data integrity in a densely packed quantum memory array.

Additional details of an example magnet-less cryogenic circulator are described with reference to FIGS. 9 and 10. In general, cryogenic circulators are used for the accurate readout of quantum bits (qubits). Cryogenic circulators operate by isolating successive components in the qubit readout line and preventing back-reflected signals from interfering with sensitive components such as the qubit or readout amplifiers. Traditional circulators, which rely on magnetic biasing of ferrite materials, are challenging to integrate with other superconducting components, in part due to their bulky nature and the need for large, incompatible magnetic bias fields.

Instead of traditional circulators, one implementation of a magnet-less cryogenic circulator topology and design are built on a layered superconducting chip. The monolithic integration of multi-bit quantum memory device with the magnet-less circular facilitates modular qubit storing and extracting without interfering with the qubits directly using any external bias.

The magnet-less circulator is based on using spatiotemporal modulation of angular momentum for microwave photons to facilitate coupling of an input signal obtained at a first circulator port of a circulator device (or simply "circulator") to a second circulator port, while impeding the flow of the signal to a third circulator port. As will be understood, the magnet-less cryogenic described herein achieves nonreciprocity while eliminating the need for circulators to rely on magnetic bias fields, resulting in reduced physical circulator size, and facilitating seamless integration with superconducting qubits. Indeed, the circulators described herein are relatively compact, low-loss, and magnet-free for integration with qubits, including on a single superconducting chip.

In one implementation, the control signal(s) for operation of the circulator can be provided by a classical computer, e.g., through a peripheral component interconnect express (PCIe)-based interface. There can be a single control line that provide the circulator modulation, or alternatively individual control lines, which allows precise control and synchronization of the modulation signals, while accommodating a larger number of qubits in the same dilution refrigerator, if, for example, a single control line is used, due to the reduced number of control wires needed per circulator. The integration facilitates seamless, real-time control of the circulator parameters, enhancing the flexibility and efficiency of quantum readout operations. By leveraging PCIe-based control, quantum systems can achieve seamless integration and compatibility with existing classical computing infrastructure, facilitating hybrid quantum-classical systems. This integration simplifies the process and reduces costs, as it aligns with widely-used classical hardware.

Figure 9:
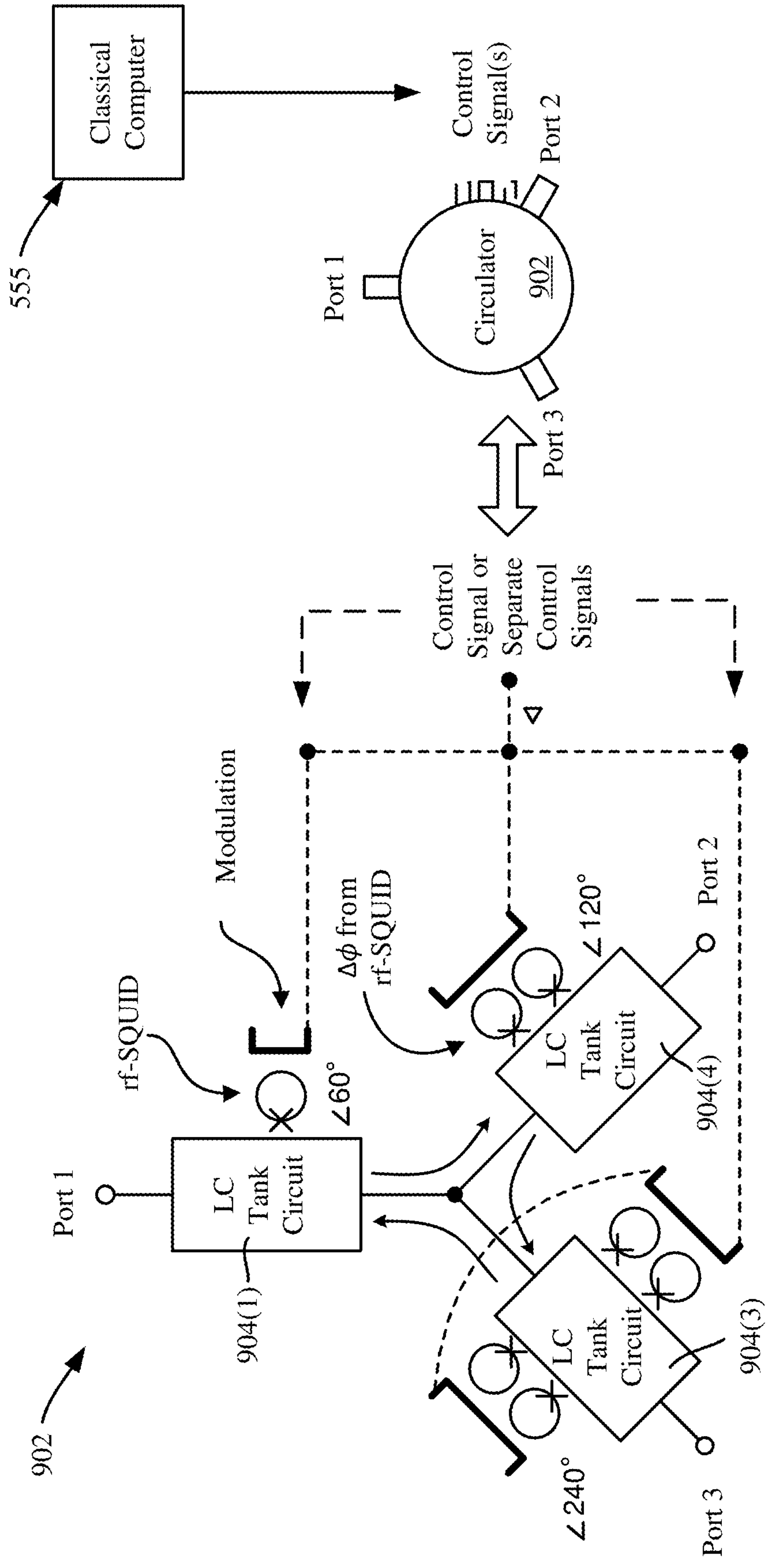
FIG. 9 is a block diagram representation of an example simulation model for a magnet-less circulator including three inductor-capacitor (LC) tank circuits with a microwave modulation signal provided to each (left portion), corresponding to a circulator with input/output ports and a control signal or signals (right portion), in accordance with various example embodiments and implementations of the subject disclosure.

FIG. 9 shows one example magnet-less circulator design 902 that includes three inductor-capacitor (LC) tank circuits 904(1)-904(3) interconnected in a star topology. Each of the LC tank circuits 904(1)-904(3) is basically a resonator that is modulated to create an effective angular momentum bias, facilitating nonreciprocal transmission. The modulation frequencies and amplitudes can be optimized to achieve desired isolation and insertion loss characteristics, making such a circulator compact, magnet-free, and suitable for integration with superconducting qubits.

For electromagnetic waves, generating angular momentum to achieve nonreciprocity can be accomplished through spatiotemporal modulation using a travelling wave. In one implementation, the circulator device 902 thus includes the three substantially identical LC tank circuits 904(1)-904(3), strongly and symmetrically interconnected in a star topology as shown in FIG. 9, each with a fixed-value capacitor and inductor.

The tank circuit inductors are strongly coupled to rf-SQUIDS (radio frequency superconducting quantum interference devices), making them flux tunable. In FIG. 9, each rf-SQUID is represented as a generally circulator loop with a crossed "x" portion representing a Josephson junction Each rf-SQUID is further coupled to a control line providing a phase change of 60° to each SQUID. The control line is provided with a modulation signal of an appropriate amplitude and frequency. The control line can be shared or there can be an individual control line per rf-SQUID.

The circuit represented in FIG. 9 does not allow transmission to any port without modulation; however, when angular momentum is imparted, the degenerate modes of the loop split, facilitating nonreciprocal transmission. To achieve the circulator operation, the resonant frequencies of three LC tank circuits 9904(1)-904(3) are modulated by the control signal (or separate control signals) with identical amplitude and a relative phase difference of 120° between the consecutive ones as shown in FIG. 9, effectively imparting electronic angular momentum to the system. Three oscillatory microwave tones are used to modulate the inductance and, therefore, the frequency of three resonant circuits in a cyclic manner. By selecting the appropriate modulation amplitude and frequency, the two modes interfere destructively at one port (port 3) and constructively at the other port (port 2), thus fulfilling the operation of a circulator. Note that this is based on having one rf-SQUID used with the first LC tank circuit 904(1), two rf-SQUIDS used with the second LC tank circuit 904(2) to provide 120° phase difference between the first and second tank circuits, and four rf-SQUIDS used with the third LC tank circuit 904(3) to provide another 120° phase difference between the second and third tank circuits (and hence a 240° phase difference between the first and third tank circuits).

In one implementation, with this topology the control signal or signals for operation of the circulator 902 can be provided from the classical computer 555, e.g., with a PCIe-based interface. Note that in varying conditions, the modulation frequency and amplitude can be tuned by the classical computer 555 to provide robust operation according to any new conditions. Further, any divergence from the 120 degree or 240 degree phase difference can be maintained, e.g., if the first LC tank circuit 904(1) is at 14 degrees, the second LC tank circuit 904(2) can be set to 134 degrees, and the third LC tank circuit 904(3) can be set to 254 degrees. Leveraging interfaces such as PCIe allows quantum systems to seamlessly integrate and remain compatible with existing classical computing infrastructure, facilitating the creation of hybrid quantum-classical systems. This alignment with widely-used classical hardware simplifies the integration process and reduces costs.

To summarize thus far, magnet-less circulators are described herein, in contrast to the large, low-bandwidth magnet-based circulators used in existing quantum measurement setups, which use bulky magnetic materials and external magnetic fields. Note that traditional magnet-based circulators can be highly impractical for integration, as the magnetic fields from traditional circulators can interfere with the qubits themselves, which are highly-sensitive to external magnetic fields; magnetic materials also can behave unpredictably at these extremely low temperatures, affecting performance. The magnet-less circulators described herein are far more compact and integrable, supporting the scaling up of quantum computers.

The magnet-less circulators described herein are based on the spatiotemporal modulation technique, somewhat akin to a compact acoustic circulator used to achieve sound isolation and nonreciprocity via mechanical rotation. Instead of mechanical rotation, electronic spatiotemporal modulation is used for microwave photons in the quantum computing circulators.

Mathematically, the circuit can be represented as three resonators with resonance frequencies of $\omega_1$, $\omega_2$, and $\omega_3$ coupled to each other with a coupling coefficient k. Without modulation, the three LC tanks resonate at the same frequency of:

$$\omega_1 = \omega_2 = \omega_3 = \omega_0 = 1/\sqrt{L_0 C}.$$

With temporal modulation $$\omega_1(t) = \omega_0 + a_m \cos(\omega_m t)$$
$$\omega_2(t) = \omega_0 + a_m \cos(\omega_m t + 2\pi/3)$$
$$\omega_3(t) = \omega_0 + a_m \cos(\omega_m t + 4\pi/3),$$

where $\omega_0$ is the static value of the resonant frequency, $a_m$ is the modulation amplitude and $\omega_m$ is the modulation frequency. The current flowing through the three resonators can be interpreted as a superposition of two counter-rotating modes. Without modulation, these two counter-rotating modes are degenerate; consequently, if a signal is applied from one port, transmission to the other ports is equal and the network is reciprocal. When modulation is applied, the modulation synthesizes an effective angular-momentum bias in the clockwise direction because the phases of the modulation signals increase by 120° in that direction, thus lifting the degeneracy of the rotating modes and enabling them to oscillate at different frequencies, achieving a nonreciprocal routing of the signals between the ports.

Figure 10:
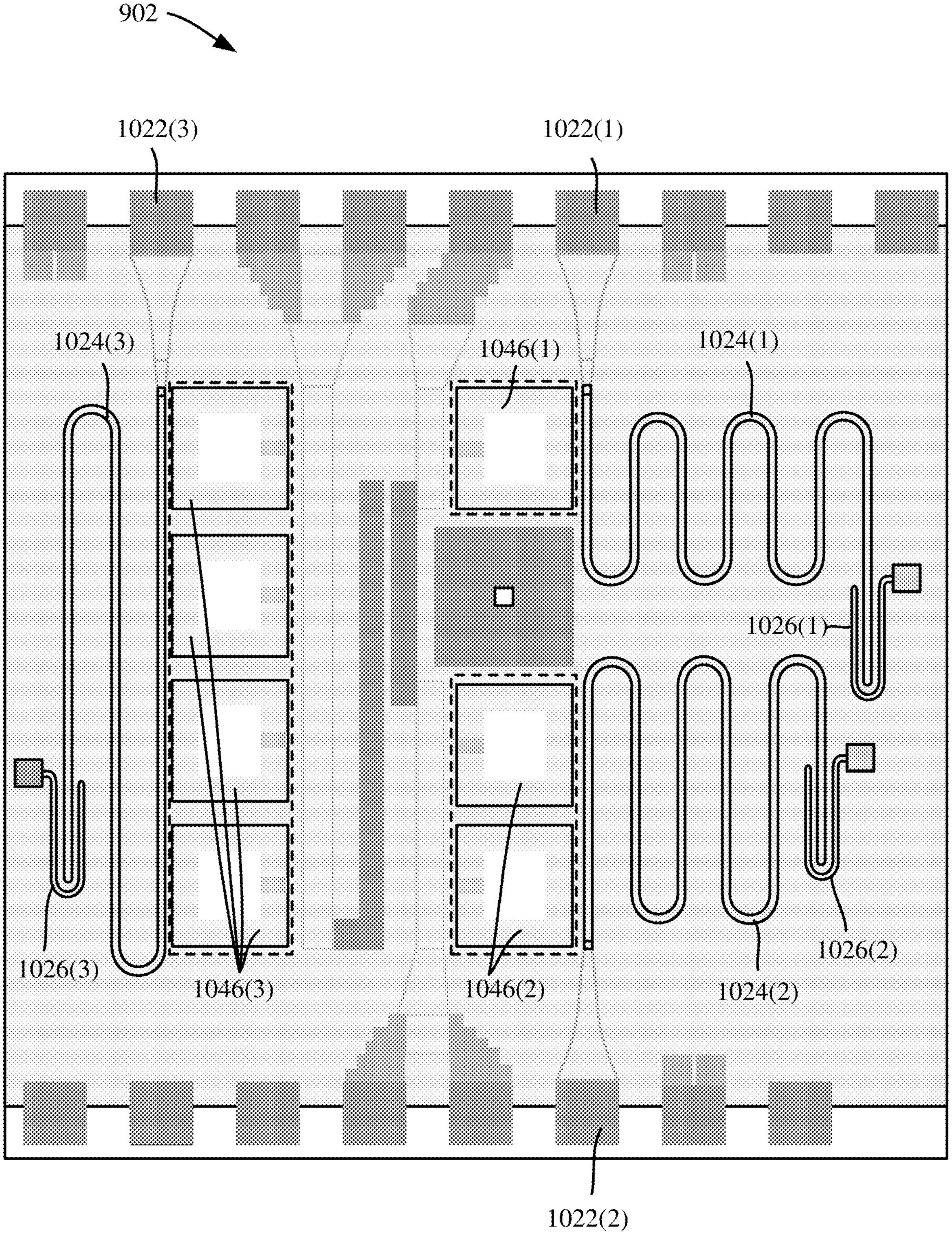
FIG. 10 is a representation of a layout of an example magnet-less circulator device that can be integrated with the four-bit quantum storage device, in accordance with various example embodiments and implementations of the subject disclosure.

FIG. 10 is a 2D view of a chip layout showing details of the example magnet-less circulator 902, (corresponding to the circulator device 102 of FIG. 1) highlighting the various internal layers and connection pads. Port 1 1022(1) is the first port of the circulator 902 where the signal input is given, port 2 1022(2) is the first output port to which the signal from port 1 222(1) travels. Any signal input at port 3 will go through port 3 1022(3) without any leakage to port 1 (unless the ports are not mismatched or intentionally shorted).

As can be seen in FIG. 10, the ports 1022(1)-1022(3) are coupled to inductors 1024(1)-1024(3), respectively, which in this implementation are serpentine (meandering) microstrip lines. The inductors 224(1)-224(3), respectively are coupled in series to capacitors 1026(1)-1026(3), respectively. To provide the increasing phase shift differences, the rf-SQUID set 1028(1) facilitates 1×tuning for the first inductor 1024(1), the rf-SQUID set 1028(2) facilitates 2×tuning for the second inductor 1024(2), and the rf-SQUID set 1028(3) facilitates 4×tuning for the third inductor 1024(3). In other words, only one rf-SQUID is coupled to the port 1 resonator/inductor 1024(1), while to achieve double the phase modulation at port 2 compared to port 1, two rf-SQUIDS are placed along the microstrip superconducting inductor 1024(2). Subsequently, four rf-SQUIDS are integrated along port 3's inductor 1024(3) to double the phase modulation compared to port 2. This design and method offer spatio-temporal modulation to achieve EM-wave spin without using any magnets near qubits.

The control signals can change the magnetic flux of the rf-SQUID sets 1028(1)-1028(3), respectively, which are magnetically coupled to the inductors 1024(1)-1024(3), respectively. The interconnects are shown as small squares; note that multiple interconnects can be present, such as for a single control signal, so as to not increase inductance while allowing more current flow. The control lines for the subsequent ports 1022(1)-1022(3) ports are respectively identified in FIG. 3 as CTRL1, CTRL2, and CTRL3.

The inductors 1024(1)-1024(3) are placed at certain distance to avoid any cross coupling, while the capacitors 1026(1)-1026(3) are connected in series with the inductors 1024(1)-1024(3), respectively, and shunted to ground while keeping them apart from any parasitic interference. Primary circuits are designed using a top superconducting thin-film (STF) layer of the layer maps.

One or more implementations and embodiments can be embodied in a system, such as described and represented in the example herein. The system can include a group of respective quantum memory cells, including respective resonators coupled to a shared resonator, and a superconducting magnet-less circulator device. The superconducting magnet-less circulator device can include a first circulator port, a second circulator port coupled to the shared resonator, and a third circulator port. A quantum bit obtained at the first circulator port is routed to the second circulator port, and the shared resonator resonates at a first frequency; one of the respective resonators can include a selected resonator tuned to resonate at the first frequency, to transfer the quantum bit from the second circulator port, via the shared resonator, to the selected resonator, and detuned to store the quantum bit in the selected resonator and prevent transfer of the quantum bit from the selected resonator back to the second circulator port, via the shared resonator.

The shared resonator and the selected resonator can be retuned to resonate at the first frequency to transfer the quantum bit as stored in the selected resonator back to the second circulator port via the shared resonator, and routed from the second circulator port to the third circulator port for readout.

The quantum bit obtained at the first circulator port can be a first quantum bit obtained at a first time, the selected resonator can be a first selected resonator, and a second quantum bit obtained at the first circulator port at a second time can be routed to the second circulator port; the shared resonator can resonate at a second frequency, and one of the respective resonators other than the first selected resonator can include a second selected resonator tuned to resonate at the second frequency, to transfer the second quantum bit from the second circulator port, via the shared resonator, to the second selected resonator, and detuned to store the second quantum bit in the second selected resonator and prevent transfer of the second quantum bit from the second selected resonator back to the second circulator port, via the shared resonator. The shared resonator and the second selected resonator can be retuned to resonate at the second frequency to transfer the second quantum bit as stored in the second selected resonator back to the second circulator port via the shared resonator, and routed from the second circulator port to the third circulator port for readout.

The shared resonator can include a relatively low quality factor resonator.

The shared resonator can include an interdigitated capacitor and a microstrip inductor tuned by one or more radio frequency-superconducting quantum interference devices.

The respective resonators can include respective relatively high quality factor resonators.

The respective resonators can include respective multi-stacked capacitors coupled to respective inductors tuned by respective radio frequency-superconducting quantum interference device groupings.

The superconducting magnet-less circulator device can include a first tank circuit, a second tank circuit and a third tank circuit; the first tank circuit can resonate out of phase with the second tank circuit and the third tank circuit, and the second tank circuit can resonate out of phase with the third tank circuit.

The first circulator port can be coupled to the first tank circuit; the first tank circuit can include a first inductor and a first capacitor resonating at a first resonant frequency, as controlled by a first modulated microwave frequency control signal coupled to a first radio frequency-superconducting quantum interference device (rf-SQUID) set inductively coupled to the first tank circuit, the second circulator port can be coupled to the second tank circuit. The second tank circuit can include a second inductor and a second capacitor resonating at a second resonant frequency as controlled by a second modulated microwave frequency control signal coupled to a second rf-SQUID set inductively coupled to the second tank circuit. The third circulator port can be coupled to the third tank circuit; the third tank circuit can include a third inductor and a third capacitor resonating at a third resonant frequency as controlled by a third modulated microwave frequency control signal coupled to a third rf-SQUID set inductively coupled to the third tank circuit. For an input signal obtained at the first circulator port, the first resonant frequency and the second resonant frequency interfere constructively to facilitate a flow of the first input signal to the second circulator port, and the first resonant frequency and the third resonant frequency interfere destructively to impede the flow of the first input signal to the third circulator port.

Figure 11:
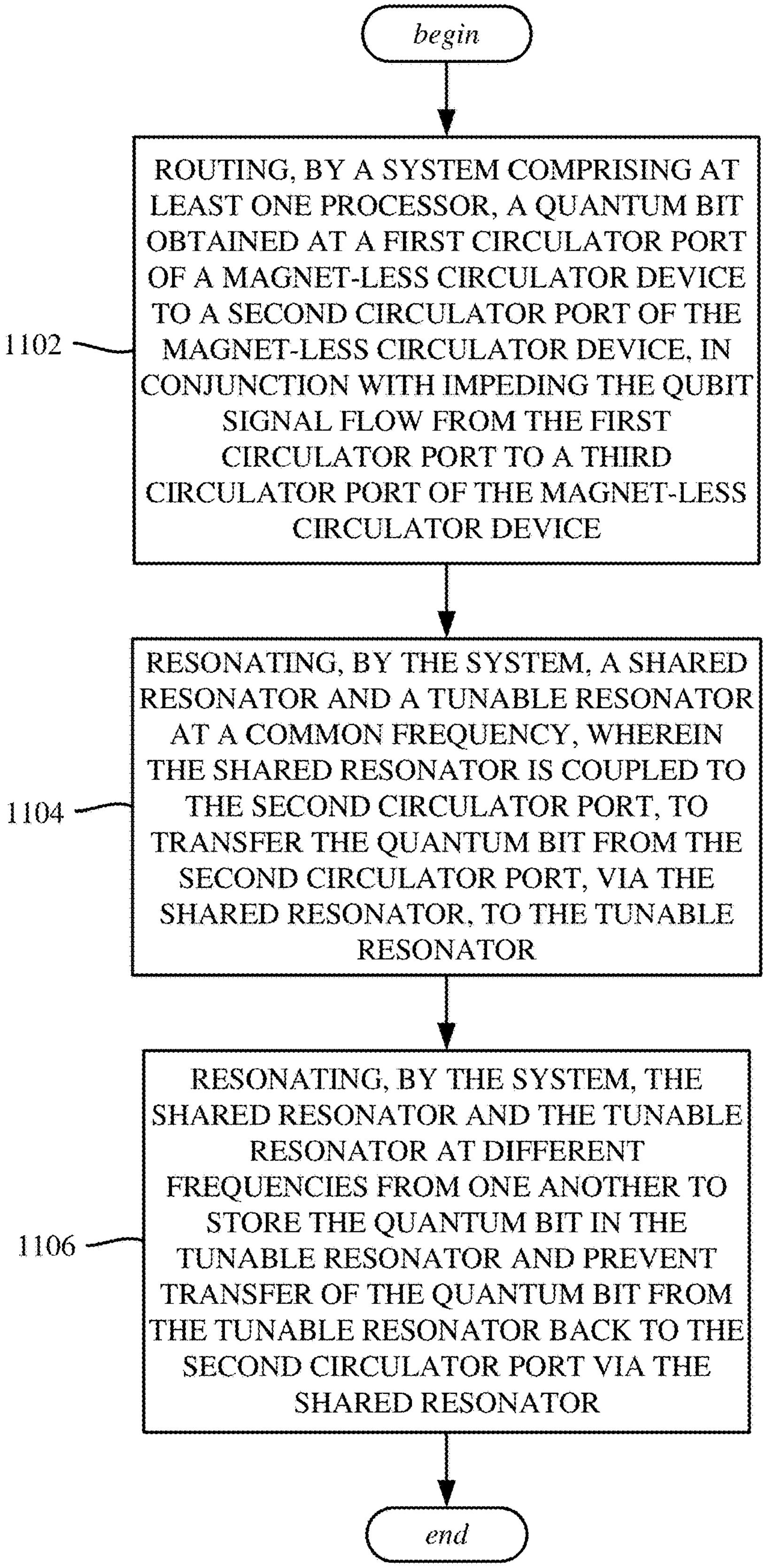
FIG. 11 is a flow diagram showing example operations related to routing a qubit via a circulator and resonating resonators to write to and then store the qubit in a storage cavity, in accordance with various example embodiments and implementations of the subject disclosure.

One or more example implementations and embodiments, such as corresponding to example operations of a method, can be represented in FIG. 11. Example operation 1102 represents routing, by a system comprising at least one processor, a quantum bit obtained at a first circulator port of a magnet-less circulator device to a second circulator port of the magnet-less circulator device, in conjunction with impeding the qubit signal flow from the first circulator port to a third circulator port of the magnet-less circulator device. Example operation 1104 represents resonating, by the system, a shared resonator and a tunable resonator at a common frequency, wherein the shared resonator can be coupled to the second circulator port, to transfer the quantum bit from the second circulator port, via the shared resonator, to the tunable resonator. Example operation 1106 represents resonating, by the system, the shared resonator and the tunable resonator at different frequencies from one another to store the quantum bit in the tunable resonator and prevent transfer of the quantum bit from the tunable resonator back to the second circulator port via the shared resonator.

Further operations can include resonating, by the system, the shared resonator and the tunable resonator at the common frequency, to transfer the quantum bit as stored in the tunable resonator back to the second port via the shared resonator for output by the system.

Further operations can include routing, by the system, the quantum bit to the third port, and reading, by the system, the quantum bit from the third port.

The shared resonator can be tunable, and resonating the shared resonator at the common frequency can include tuning the shared resonator to the common frequency.

Resonating the tunable resonator at the common frequency can include tuning the tunable resonator to the common frequency.

The quantum bit can include a first quantum bit obtained at a first time, the tunable resonator can be a first tunable resonator, the common frequency can be a first common frequency, the different frequencies can be first different frequencies, and further operations can include routing, by the system, a second quantum bit obtained at the first circulator port at a second time, and resonating, by the system, the shared resonator and a second tunable resonator at a second common frequency; the second shared resonator can be coupled to the second circulator port, to transfer the second quantum bit from the second circulator port, via the shared resonator, to the second tunable resonator. Further operations can include resonating, by the system, the shared resonator and the second tunable resonator at second different frequencies from one another to store the quantum bit in the second tunable resonator and prevent transfer of the second quantum bit from the second tunable resonator back to the second circulator port via the shared resonator, routing, by the system, a third quantum bit obtained at the first circulator port at a third time, and resonating, by the system, the shared resonator and a third tunable resonator at a third common frequency; the third shared resonator can be coupled to the second circulator port, to transfer the third quantum bit from the second circulator port, via the shared resonator, to the third tunable resonator. Further operations can include resonating, by the system, the shared resonator and the third tunable resonator at third different frequencies from one another to store the quantum bit in the third tunable resonator and prevent transfer of the third quantum bit from the third tunable resonator back to the second circulator port via the shared resonator, routing, by the system, a fourth quantum bit obtained at the first circulator port at a fourth time, and resonating, by the system, the shared resonator and a fourth tunable resonator at a fourth common frequency; the fourth shared resonator can be coupled to the second circulator port, to transfer the fourth quantum bit from the second circulator port, via the shared resonator, to the fourth tunable resonator. Further operations can include resonating, by the system, the shared resonator and the fourth tunable resonator at fourth different frequencies from one another to store the fourth quantum bit in the fourth tunable resonator and prevent transfer of the fourth quantum bit from the fourth tunable resonator back to the second circulator port via the shared resonator.

One or more implementations and embodiments can be embodied in a system, such as described and represented in the example herein. The system can include a group of respective quantum memory cells, including respective resonators coupled to a shared resonator, and a superconducting magnet-less circulator device. The superconducting magnet-less circulator device ca include a first circulator port, a second circulator port coupled to the shared resonator, and a third circulator port; respective quantum bits obtained at the first circulator port at respective different times can be routed to the second circulator port, the respective resonators can be tuned via respective radio frequency-superconducting quantum interference device (rf-SQUID) groupings coupled to the respective resonators, to respectively resonate at respective different frequencies at the respective different times to transfer the respective quantum bits from the second circulator port, via the shared resonator, to the respective resonators, and can be respectively detuned to respectively store the respective quantum bits in the respective resonators and respectively prevent transfer of the respective quantum bits from the respective resonators back to the second circulator port, via the shared resonator.

The shared resonator can be tunable based on one or more other rf-SQUIDS coupled to the shared resonator.

The respective resonators can include four total relatively high quality factor resonators, and the shared resonator can include a single relatively low quality factor resonator.

The superconducting magnet-less circulator device can include a first tank circuit coupled to the first circulator port, a second tank circuit coupled to the second circulator port, and a third tank circuit coupled to the third circulator port; respective resonations of the first tank circuit, of the second tank circuit, and the third tank circuit can result in an electronic angular momentum being imparted to the magnet-less circulator device, and the electronic angular momentum being imparted to the magnet-less circulator device can result in constructive interference of a first resonance frequency of the tank circuit and a second resonance frequency of the second tank circuit that routes the qubit signal flow from the first circulator port to the second circulator port, and further can result in destructive interference of the first frequency and a third frequency of the third tank circuit that impedes the qubit signal flow from the first circulator port to the third circulator port.

As can be seen, the technology described herein facilitates a broadband multi-resonator random access quantum memory interface device including tunable resonators and a magnet-less circulator. The compact and magnet-free design stack offers stable and reliable operation at cryogenic temperatures. Detailed simulations have validated the technology.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As used in this application, the terms "component," "system," "platform," "layer," "selector," "interface," and the like are intended to refer to a computer-related resource or an entity related to an operational apparatus with one or more specific functionalities, wherein the entity can be either hardware, a combination of hardware and software, software, or software in execution. As an example, a component can be an apparatus with specific functionality provided by mechanical parts operated by electric or electronic circuitry. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While the embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the various embodiments are not to be limited to any single implementation, but rather are to be construed in breadth, spirit and scope in accordance with the appended claims.

What is claimed is:

1. A system, comprising:

a group of respective quantum memory cells, comprising respective resonators coupled to a shared resonator; and a superconducting magnet-less circulator device, comprising a first circulator port, a second circulator port coupled to the shared resonator, and a third circulator port, wherein a quantum bit obtained at the first circulator port is routed to the second circulator port, and wherein the shared resonator resonates at a first frequency, and one of the respective resonators comprises a selected resonator tuned to resonate at the first frequency, to transfer the quantum bit from the second circulator port, via the shared resonator, to the selected resonator, and detuned to store the quantum bit in the selected resonator and prevent transfer of the quantum bit from the selected resonator back to the second circulator port, via the shared resonator.

2. The system of claim 1, wherein the shared resonator and the selected resonator are retuned to resonate at the first frequency to transfer the quantum bit as stored in the selected resonator back to the second circulator port via the shared resonator, and routed from the second circulator port to the third circulator port for readout.

3. The system of claim 1, wherein the quantum bit obtained at the first circulator port is a first quantum bit obtained at a first time, wherein the selected resonator is a first selected resonator, and wherein a second quantum bit obtained at the first circulator port at a second time is routed to the second circulator port, wherein the shared resonator resonates at a second frequency, and one of the respective resonators other than the first selected resonator comprises a second selected resonator tuned to resonate at the second frequency, to transfer the second quantum bit from the second circulator port, via the shared resonator, to the second selected resonator, and detuned to store the second quantum bit in the second selected resonator and prevent transfer of the second quantum bit from the second selected resonator back to the second circulator port, via the shared resonator.

4. The system of claim 3, wherein the shared resonator and the second selected resonator are retuned to resonate at the second frequency to transfer the second quantum bit as stored in the second selected resonator back to the second circulator port via the shared resonator, and routed from the second circulator port to the third circulator port for readout.

5. The system of claim 1, wherein the shared resonator comprises a relatively low quality factor resonator.

6. The system of claim 1, wherein the shared resonator comprises an interdigitated capacitor and a microstrip inductor tuned by one or more radio frequency-superconducting quantum interference devices.

7. The system of claim 1, wherein the respective resonators comprise respective relatively high quality factor resonators.

8. The system of claim 1, wherein the respective resonators comprise respective multi-stacked capacitors coupled to respective inductors tuned by respective radio frequency-superconducting quantum interference device groupings.

9. The system of claim 1, wherein the superconducting magnet-less circulator device comprises a first tank circuit, a second tank circuit and a third tank circuit, wherein the first tank circuit resonates out of phase with the second tank circuit and the third tank circuit, and wherein the second tank circuit resonates out of phase with the third tank circuit.

10. The system of claim 9, wherein the first circulator port is coupled to the first tank circuit, the first tank circuit comprising a first inductor and a first capacitor resonating at a first resonant frequency, as controlled by a first modulated microwave frequency control signal coupled to a first radio frequency-superconducting quantum interference device (rf-SQUID) set inductively coupled to the first tank circuit, wherein the second circulator port is coupled to the second tank circuit, the second tank circuit comprising a second inductor and a second capacitor resonating at a second resonant frequency as controlled by a second modulated microwave frequency control signal coupled to a second rf-SQUID set inductively coupled to the second tank circuit, wherein the third circulator port is coupled to the third tank circuit, the third tank circuit comprising a third inductor and a third capacitor resonating at a third resonant frequency as controlled by a third modulated microwave frequency control signal coupled to a third rf-SQUID set inductively coupled to the third tank circuit, and wherein, for an input signal obtained at the first circulator port, the first resonant frequency and the second resonant frequency interfere constructively to facilitate a flow of the first input signal to the second circulator port, and the first resonant frequency and the third resonant frequency interfere destructively to impede the flow of the first input signal to the third circulator port.

11. A method, comprising:

routing, by a system comprising at least one processor, a quantum bit obtained at a first circulator port of a magnet-less circulator device to a second circulator port of the magnet-less circulator device, in conjunction with impeding the qubit signal flow from the first circulator port to a third circulator port of the magnet-less circulator device;

resonating, by the system, a shared resonator and a tunable resonator at a common frequency, wherein the shared resonator is coupled to the second circulator port, to transfer the quantum bit from the second circulator port, via the shared resonator, to the tunable resonator; and resonating, by the system, the shared resonator and the tunable resonator at different frequencies from one another to store the quantum bit in the tunable resonator and prevent transfer of the quantum bit from the tunable resonator back to the second circulator port via the shared resonator.

12. The method of claim 11, further comprising resonating, by the system, the shared resonator and the tunable resonator at the common frequency, to transfer the quantum bit as stored in the tunable resonator back to the second port via the shared resonator for output by the system.

13. The method of claim 12, further comprising routing, by the system, the quantum bit to the third port, and reading, by the system, the quantum bit from the third port.

14. The method of claim 11, wherein the shared resonator is tunable, and wherein the resonating of the shared resonator at the common frequency comprises tuning the shared resonator to the common frequency.

15. The method of claim 11, wherein the resonating of the tunable resonator at the common frequency comprises tuning the tunable resonator to the common frequency.

16. The method of claim 11, wherein the quantum bit comprises a first quantum bit obtained at a first time, wherein the tunable resonator is a first tunable resonator, wherein the common frequency is a first common frequency, wherein the different frequencies are first different frequencies, and further comprising:

routing, by the system, a second quantum bit obtained at the first circulator port at a second time, resonating, by the system, the shared resonator and a second tunable resonator at a second common frequency, wherein the second shared resonator is coupled to the second circulator port, to transfer the second quantum bit from the second circulator port, via the shared resonator, to the second tunable resonator;

resonating, by the system, the shared resonator and the second tunable resonator at second different frequencies from one another to store the quantum bit in the second tunable resonator and prevent transfer of the second quantum bit from the second tunable resonator back to the second circulator port via the shared resonator;

routing, by the system, a third quantum bit obtained at the first circulator port at a third time, resonating, by the system, the shared resonator and a third tunable resonator at a third common frequency, wherein the third shared resonator is coupled to the second circulator port, to transfer the third quantum bit from the second circulator port, via the shared resonator, to the third tunable resonator;

resonating, by the system, the shared resonator and the third tunable resonator at third different frequencies from one another to store the quantum bit in the third tunable resonator and prevent transfer of the third quantum bit from the third tunable resonator back to the second circulator port via the shared resonator;

routing, by the system, a fourth quantum bit obtained at the first circulator port at a fourth time, resonating, by the system, the shared resonator and a fourth tunable resonator at a fourth common frequency, wherein the fourth shared resonator is coupled to the second circulator port, to transfer the fourth quantum bit from the second circulator port, via the shared resonator, to the fourth tunable resonator; and resonating, by the system, the shared resonator and the fourth tunable resonator at fourth different frequencies from one another to store the fourth quantum bit in the fourth tunable resonator and prevent transfer of the fourth quantum bit from the fourth tunable resonator back to the second circulator port via the shared resonator.

17. A system, comprising:

a group of respective quantum memory cells, comprising respective resonators coupled to a shared resonator; and a superconducting magnet-less circulator device, comprising a first circulator port, a second circulator port coupled to the shared resonator, and a third circulator port, wherein respective quantum bits obtained at the first circulator port at respective different times are routed to the second circulator port, wherein the respective resonators are tuned via respective radio frequency-superconducting quantum interference device (rf-SQUID) groupings coupled to the respective resonators, to respectively resonate at respective different frequencies at the respective different times to transfer the respective quantum bits from the second circulator port, via the shared resonator, to the respective resonators, and are respectively detuned to respectively store the respective quantum bits in the respective resonators and respectively prevent transfer of the respective quantum bits from the respective resonators back to the second circulator port, via the shared resonator.

18. The system of claim 17, wherein the shared resonator is tunable based on one or more other rf-SQUIDS coupled to the shared resonator.

19. The system of claim 17, wherein the respective resonators comprises four total relatively high quality factor resonators, and wherein the shared resonator comprises a single relatively low quality factor resonator.

20. The system of claim 17, wherein the superconducting magnet-less circulator device comprises a first tank circuit coupled to the first circulator port, a second tank circuit coupled to the second circulator port, and a third tank circuit coupled to the third circulator port, wherein respective resonations of the first tank circuit, of the second tank circuit, and the third tank circuit result in an electronic angular momentum being imparted to the magnet-less circulator device, and wherein the electronic angular momentum being imparted to the magnet-less circulator device results in constructive interference of a first resonance frequency of the tank circuit and a second resonance frequency of the second tank circuit that routes the qubit signal flow from the first circulator port to the second circulator port, and further results in destructive interference of the first frequency and a third frequency of the third tank circuit that impedes the qubit signal flow from the first circulator port to the third circulator port.

* * * * *